US012732159B2

(12) United States Patent
Huang et al.

(10) Patent No.: US 12,732,159 B2

(45) Date of Patent: Sep. 8, 2026

(54) FILM BULK ACOUSTIC RESONATOR AND FABRICATION METHOD THEREOF

(71) Applicant: Ningbo Semiconductor International Corporation, Ningbo (CN)

(72) Inventors: Herb He Huang, Ningbo (CN); Hailong Luo, Ningbo (CN); Wei Li, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 1035 days.

(21) Appl. No.: 17/941,441

(22) Filed: Sep. 9, 2022

(65) Prior Publication Data

US 2023/0006644 A1 Jan. 5, 2023

Related U.S. Application Data

(63) Continuation of application No. PCT/CN2020/137048, filed on Dec. 17, 2020.

(30) Foreign Application Priority Data

Mar. 10, 2020 (CN) ........................ 202010161971.X

(51) Int. Cl.

*H03H 9/00* (2006.01)

*H03H 3/02* (2006.01)

(Continued)

(52) U.S. Cl.

CPC .............. *H03H 9/173* (2013.01); *H03H 3/02* (2013.01); *H03H 9/13* (2013.01); *H03H 2003/021* (2013.01)

(58) Field of Classification Search

CPC ............ H03H 9/173; H03H 3/02; H03H 9/13; H03H 2003/021; H03H 2003/023;

(Continued)

(56) References Cited

U.S. PATENT DOCUMENTS 10,797,681 B1 * 10/2020 Hurwitz ............ H01L 21/76871

2004/0032012 A1 * 2/2004 Wong ..................... H03H 9/105 257/E21.499

(Continued)

FOREIGN PATENT DOCUMENTS

CN 107947751 A 4/2018

CN 108075743 A 5/2018

(Continued)

*Primary Examiner* — Julio C. Gonzalez

(74) *Attorney, Agent, or Firm* — Anova Law Group, PLLC

(57) ABSTRACT

The present disclosure provides a film bulk acoustic resonator and a method for fabricating the film bulk acoustic resonator. The resonator includes a carrier substrate; a support layer bonded on the carrier substrate, where the support layer encloses a first cavity exposing the carrier substrate; a piezoelectric stacked structure covering the first cavity, where the piezoelectric stacked structure includes a first electrode, a piezoelectric layer, and a second electrode which are stacked sequentially from a bottom to a top; and protrusions disposed at a boundary of an effective resonance region, where the protrusions are disposed on an upper surface or a lower surface of the piezoelectric stacked structure; or a part of the protrusions is disposed on the upper surface of the piezoelectric stacked structure, and another part of the protrusions is disposed on the lower surface of the piezoelectric stacked structure.

11 Claims, 4 Drawing Sheets

(51) Int. Cl.
*H03H 9/13* (2006.01)
*H03H 9/17* (2006.01)

(58) Field of Classification Search
CPC .... H03H 9/0514; H03H 9/1035; H03H 9/174; H03H 3/04; H03H 9/02; H03H 9/02015; H03H 9/02086; H03H 9/02157; H03H 2003/0442; H03H 2009/02173
See application file for complete search history.

(56) References Cited

U.S. PATENT DOCUMENTS

2011/0298564 A1* 12/2011 Iwashita ................ H03H 9/173 333/187
2018/0138885 A1* 5/2018 Stokes ............... H03H 9/02047

FOREIGN PATENT DOCUMENTS

| | | | |
|---|---|---|---|
| CN | 109660227 | A | 4/2019 |
| CN | 110829997 | A | 2/2020 |
| CN | 112039465 | A | 12/2020 |

* cited by examiner

FILM BULK ACOUSTIC RESONATOR AND FABRICATION METHOD THEREOF

CROSS-REFERENCE TO RELATED APPLICATION

This application is a continuation application of PCT Patent Application No. PCT/CN2020/137048, filed on Dec. 17, 2020, which claims priority to Chinese patent application No. 202010161971.X, filed on Mar. 10, 2020, the entirety of all of which is incorporated herein by reference.

FIELD OF THE DISCLOSURE

The present disclosure generally relates to the field of semiconductor device manufacturing, and more particularly, relates to a film bulk acoustic resonator and a fabrication method thereof.

BACKGROUND

With continuous development of wireless communication technology, in order to meet multi-functional requirements of various wireless communication terminals, the terminal equipment needs to be capable of transmitting data using different carrier frequency spectra. Meantime, in order to support a sufficient data transmission rate within a limited bandwidth, strict performance requirements are needed for radio frequency systems. A radio frequency filter is an important part of the radio frequency system, which can filter out the interference and noise outside the communication spectrum to meet requirements of the signal-to-noise ratio of the radio frequency system and communication protocols. Taking a mobile phone as an example, since each frequency band needs a corresponding filter, dozens of filters may need to be s configured in the mobile phone.

Normally, the film bulk acoustic resonator includes two film electrodes, and a piezoelectric film layer is arranged between two film electrodes. The working principle of the film bulk acoustic resonator is described as the following. The piezoelectric film layer is configured to generate vibration under an alternating electric field; the vibration excites the bulk acoustic wave propagating along the thickness direction of the piezoelectric film layer; and such acoustic wave may be reflected back from the interface between the air and each of two film electrodes, and then be reflected back and forth inside the film layer to form an oscillation. When the acoustic wave propagates in the piezoelectric film layer having exactly an odd multiple of half wavelength, a standing wave oscillation is formed.

However, current cavity-type film bulk acoustic resonators fabricated have problems such as lateral wave loss, insufficient structural strength, the quality factor (Q) which cannot be further improved, low yield and the like, so that these resonators cannot meet the needs of high-performance radio frequency systems.

BRIEF SUMMARY OF THE DISCLOSURE

One aspect of the present disclosure provides a film bulk acoustic resonator. The resonator includes a carrier substrate; a support layer, bonded on the carrier substrate, where the support layer encloses a first cavity exposing the carrier substrate; a piezoelectric stacked structure, covering the first cavity, where the piezoelectric stacked structure includes a first electrode, a piezoelectric layer, and a second electrode which are stacked sequentially from a bottom to a top; and protrusions, disposed at a boundary of an effective resonance region, where the protrusions are disposed on an upper surface or a lower surface of the piezoelectric stacked structure; or a part of the protrusions is disposed on the upper surface of the piezoelectric stacked structure, and another part of the protrusions is disposed on the lower surface of the piezoelectric stacked structure.

Another aspect of the present disclosure provides a method for fabricating a film bulk acoustic resonator. The method includes providing a temporary substrate; forming a piezoelectric stacked structure on the temporary substrate, where the piezoelectric stacked structure includes a second electrode, a piezoelectric layer, and a first electrode which are sequentially arranged from a bottom to a top; forming protrusions on one of the first electrode, the second electrode and the piezoelectric layer; or forming a part of the protrusions on one of the first electrode, the second electrode and the piezoelectric layer, and forming another part of the protrusions on another one of the first electrode, the second electrode and the piezoelectric layer, where projections of the protrusions on the piezoelectric layer are at a boundary of an effective resonance region; forming a support layer to cover the piezoelectric stacked structure; patterning the support layer to form a first cavity, where the first cavity passes through the support layer; bonding a carrier substrate on the support layer, where the carrier substrate covers the first cavity; and removing the temporary substrate.

Other aspects of the present disclosure can be understood by those skilled in the art in light of the description, the claims, and the drawings of the present disclosure.

BRIEF DESCRIPTION OF THE DRAWINGS

The above and other objectives, features and advantages of the present disclosure are more apparent from more detailed description of exemplary embodiments of the present disclosure in conjunction with accompanying drawings. In exemplary embodiments of the present disclosure, same reference numerals normally refer to same parts.

DETAILED DESCRIPTION

Figure 1:
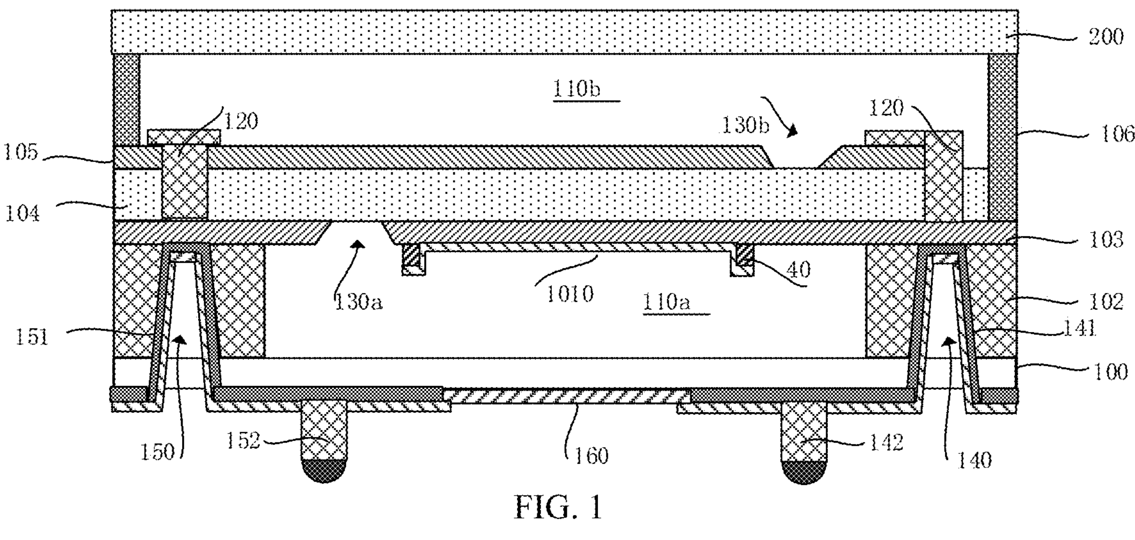
FIG. 1 illustrates a structural schematic of a film bulk acoustic resonator according to exemplary embodiment one of the present disclosure.

The present disclosure is further described in detail with reference to accompanying drawings and specific embodiments hereinafter. The advantages and features of the present disclosure may be more apparent according to the following description and accompanying drawings. However, it should be noted that the concept of the technical solution of the present disclosure may be implemented in various different forms and may not be limited to specific embodiments set forth herein. The accompanying drawings may be all in simplified forms and non-precise scales and may be merely for convenience and clarity of the purpose of embodiments of the present disclosure.

It should be understood that when an element or layer is referred to as being “on” “adjacent to”, “connected with”, or "coupled to" other elements or layers, the element or layer may be directly on the other elements or layers, or may be adjacent to, connected to, or coupled to other elements or layers; or there may be intermediate elements or layers. In contrast, when an element is referred to as being "directly on", "directly adjacent to", "directly connected with", or "directly coupled to" other elements or layers, there may not be intermediate elements or layers. It should be understood that, although the terms first, second, third and the like may be configured to describe various elements, components, regions, layers and/or sections, these elements, components, regions, layers and/or sections should not be limited by these terms. These terms are only used to distinguish one element, component, region, layer or section from another element, component, region, layer or section. Thus, the first element, component, region, layer or section discussed below could be termed the second element, component, region, layer or section without departing from the scope of the present disclosure.

Spatial relation terms such as "under", "below", "beneath", "above", "over" and the like may be configured herein for convenience of description to describe the relationship of one element or feature to other elements or features shown in the drawings. It should be understood that spatial relation terms may be intended to include different orientations of the device in use and operation in addition to the orientation shown in the drawings. For example, if the device in the drawings is turned over, then elements or features described as "below" or "beneath" or "under" other elements or features would then be oriented "above" the other elements or features. Thus, exemplary terms "below" and "under" may include both up and down orientations. The device may be otherwise oriented (rotated 90 degrees or at other orientations) and the spatial descriptors used herein may be interpreted accordingly.

The terminology used herein may be for the purpose of describing particular embodiments only and may not be intended to limit the present disclosure. As used herein, the singular forms "a", "an", and "the/said" may be intended to include plural forms as well, unless the context clearly dictates otherwise. It should also be understood that terms "contain" and/or "include", when used in the specification, may be configured to determine the presence of stated features, integers, steps, operations, elements and/or components, but may not exclude one or more other presence or addition of features, integers, steps, operations, elements, parts and/or groups. As used herein, the term "and/or" may include any and all combinations of associated listed items.

If the method described herein includes a series of steps, the step order presented herein may not be necessarily the only order in which the steps is performed, and some of the steps may be omitted and/or other steps, which are not described herein, may be added to the method. If components in one of the drawings are same as components in other drawings, although the components may be easily recognized in all drawings, in order to make the description of the drawings clearer, labels of all same components may not be marked in each drawing in the present specification.

Exemplary Embodiment One

A film bulk acoustic resonator is provided in one embodiment. FIG. 1 illustrates a structural schematic of a film bulk acoustic resonator according to exemplary embodiment one of the present disclosure. Referring to FIG. 1, the film bulk acoustic resonator may include a carrier substrate 100; a support layer 102 bonded on the carrier substrate 100, where the support layer 102 encloses a first cavity 110*a*, and the first cavity 110*a* exposes the carrier substrate 100; a piezoelectric stacked structure covering the first cavity 110*a*, where the piezoelectric stacked structure includes a first electrode 103, a piezoelectric layer 104 and a second electrode 105 stacked sequentially from bottom to top; and protrusions 40 disposed at the boundary of the effective resonance region, where the protrusions 40 are disposed on the upper surface or the lower surface of the piezoelectric stacked structure; or a part of the protrusions 40 is disposed on the upper surface of the piezoelectric stacked structure, and another part of the protrusions 40 is disposed on the lower surface of the piezoelectric stacked structure.

In one embodiment, the protrusions 40 may all be located on the lower surface of the piezoelectric stacked structure, and all be located on the side where the first cavity 110*a* is located. The region surrounded by the protrusions 40 may be an effective resonance region, and the outside of the protrusions 40 may be an ineffective resonance region. The first electrode 103, the piezoelectric layer 104 and the second electrode 105 in the effective resonance region may be overlapped with each other along the direction perpendicular to the carrier substrate 100. In other embodiments, the protrusions 40 may all be located on the upper surface of the piezoelectric stacked structure, away from the side where the first cavity 110*a* is located. The protrusions 40 may also be partially disposed on the upper surface of the piezoelectric stacked structure, and partially disposed on the lower surface of the piezoelectric stacked structure.

In one embodiment, the projections of the protrusions 40 on the carrier substrate 100 may form a closed ring shape, such as a closed irregular polygon, circle or ellipse. The protrusions 40 may make acoustic impedance mismatch between the effective resonance region enclosed by the protrusions and the region where the protrusions 40 are located, which may effectively prevent lateral acoustic wave leakage and improve the quality factor of the resonator. In other embodiments, the projections of the protrusions 40 on the carrier substrate 100 may not be a completely closed shape. It should be understood that when the projections of the protrusions 40 on the carrier substrate 100 is a closed shape, it is more beneficial for preventing lateral acoustic wave leakage.

The material of the protrusion 40 may be a conductive material or a dielectric material. When the material of the protrusion 40 is a conductive material, it can be same as the material of the first electrode 103 or the second electrode 105; and when the material of the protrusion 40 is a dielectric material, it can be any one of silicon oxide, silicon nitride, silicon oxynitride or silicon carbonitride, but may not be limited to above-mentioned materials.

The carrier substrate 100 may be made of at least one of the following mentioned materials, including silicon (Si), germanium (Ge), silicon germanium (SiGe), silicon carbon (SiC), silicon germanium carbon (SiGeC), indium arsenide (InAs), gallium arsenide (GaAs), indium phosphide (InP) or other III/V compound semiconductors, a multilayer structure including these semiconductors, a ceramic substrate such as alumina, a quartz, glass substrate, or the like.

The support layer 102 may be bonded on the carrier substrate 100, and the support layer 102 may enclose the first cavity 110*a*; and the first cavity 110*a* may expose the carrier substrate 100. In one embodiment, the first cavity 110*a* may be a ring-shape closed cavity, and the first cavity 110*a* may be formed by etching the support layer 102 through an etching process, which may not limit the technology of the present disclosure. It should be noted that the support layer 102 may be combined with the carrier substrate 100 by a bonding manner, and the bonding manner may include covalent bonding, adhesive bonding or fusion bonding. In one embodiment, the support layer 102 and the carrier substrate 100 may be bonded through a bonding layer 101, and the material of the bonding layer 101 may include silicon oxide, silicon nitride, silicon oxynitride, silicon carbonitride or ethyl silicate.

In one embodiment, the shape of the bottom surface of the first cavity 110*a* is a rectangle. However, in other embodiments of the present disclosure, the shape of the first cavity 110*a* on the bottom surface of the first electrode 103 may also be a circle, an ellipse, or a polygon other than a rectangle such as a pentagon or a hexagon. The material of the support layer 102 may be any suitable dielectric material, which may include, but may not be limited to, one of silicon oxide, silicon nitride, silicon oxynitride, silicon carbonitride and other materials. The materials of the support layer 102 and the bonding layer 101 may be same.

The piezoelectric stacked structure may be disposed above the first cavity 110*a*. The piezoelectric stacked structure may include the first electrode 103, the piezoelectric layer 104 and the second electrode 105 in sequence from bottom to top. The first electrode 103 may be on the support layer 102, the piezoelectric layer 104 may be on the first electrode 103, and the second electrode 105 may be on the piezoelectric layer 104. The first electrode 103, the piezoelectric layer 104 and the second electrode 105 above the first cavity 110*a* may have an overlapped region along the direction perpendicular to the carrier substrate 100, and the overlapped region inside the protrusions 40 may be the effective resonance region.

In one embodiment, the piezoelectric layer 104 may cover the first cavity 110*a*; and covering the first cavity 110*a* should be understood as the piezoelectric layer 104 is a complete film layer without being etched. It does not mean that the piezoelectric layer 104 may completely cover the first cavity 110*a* to form a sealed cavity. Obviously, the piezoelectric layer 104 may completely cover the first cavity 110*a* to form a sealed cavity. Without etching the piezoelectric layer, the piezoelectric stacked structure may be guaranteed to have a certain thickness, so that the resonator has a certain structural strength, thereby improving the yield of fabricated resonator.

In one embodiment, an etch stop layer may be further disposed between the support layer 102 and the first electrode 103; and the material of the etch stop layer may include, but may not be limited to, silicon nitride ($Si_3N_4$) and silicon oxynitride (SiON). On the one hand, the etch stop layer may be used to increase the structural stability of final fabricated film bulk acoustic resonator; on the other hand, the etch stop layer may have a lower etching rate than the support layer 102, which may prevent over-etching during the process of etching the support layer 102 to form the first cavity 110*a* and protect the surface of the first electrode 103 under the etch stop layer from be damaged, thereby improving device performance and reliability.

In one embodiment, the surface of the piezoelectric stacked structure may further include a first trench 130*a* and a second trench 130*b*. The first trench 130*a* may be on the lower surface of the piezoelectric stacked structure and on the side where the first cavity 110*a* is located and may pass through the first electrode 103 and surround the periphery of the region where the protrusions 40 are located. The second trench 130*b* may be on the upper surface of the piezoelectric stacked structure, pass through the second electrode 105, and surround the periphery of the region where the protrusions 40 are located. Two ends of the first trench 130*a* may be disposed opposite to two ends of the second trench 130*b*, such that projections of the first trench 130*a* and the second trench 130*b* on the carrier substrate 100 may include two junctions; and at each junction, adjacent ends of the first and second trenches may be connected or have a spacing therebetween. In one embodiment, the projections of the protrusions 40 on the piezoelectric layer 104 may form a closed polygon, and the inner edges of the first trench 130*a* and the second trench 130*b* may be disposed along the outer boundary of the protrusions 40, that is, the outer boundary of the protrusions 40 may be completely coincident with the inner edges of the first trench 130*a* and the second trench 130*b*. The projections of the first trench 130*a* and the second trench 130*b* on the carrier substrate 100 may form a closed shape, which may be consistent with the pattern shape of the projections of the protrusions 40 on the carrier substrate 100 and located at the periphery of the projections formed by the protrusions 40.

It should be understood that the protrusions 40 may be ring-shaped (when the protrusions 40 are all on the lower surface or the upper surface of the piezoelectric stacked structure, the protrusions 40 may form a ring shape; and when the protrusions 40 are on two surfaces of the piezoelectric stacked structure, the projections of two parts of the protrusions may together form a complete ring). When the protrusions 40 are all located on the upper surface or the lower surface of the piezoelectric stacked structure, the first trench 130*a* may surround the periphery of a part of the protrusions 40, and the second trench 130*b* may surround the periphery of remaining part of the protrusions 40 (at this point, the second trench 130*b* surrounding the periphery of the protrusions 40 means that the second trench 130*b* may surround the periphery of the surface of the piezoelectric stacked structure in the region of the protrusions 40, and may not directly surround the periphery of the protrusions 40). When the protrusions 40 are partially disposed on the upper surface of the piezoelectric stacked structure and partially disposed on the lower surface of the piezoelectric stacked structure, the first trench 130*a* may surround the periphery of the protrusions 40 on the lower surface of the piezoelectric stacked structure, and the second trench 130*b* may surround the periphery of the protrusions 40 on the upper surface of the piezoelectric stacked structure. However, the present disclosure may not be limited to above description, as long as the first trench 130*a* and the second trench 130*b* may cooperate with each other to surround the periphery of the region where the protrusions 40 are located.

The protrusions 40 may mismatch the acoustic impedance of the region inside the protrusions with the acoustic impedance of the region where the protrusions are located, which may define the boundary of the effective resonance region of the resonator. The first trench 130*a* and the second trench 130*b* may separate the first electrode 103 and the second electrode 105 respectively, so that the resonator cannot meet a working condition (the working condition is that the first electrode 103, the piezoelectric layer 104 and the second electrode 105 are overlapped with each other along the thickness direction), which may further define the boundary of the effective resonance region of the resonator. The protrusions 40 may make the acoustic impedance mismatch through addition of the mass; and the first trench 130*a* and the second trench 130*b* may make the acoustic impedance mismatch by contacting the electrode end face with air, which may both prevent lateral acoustic wave leakage and improve the Q value of the resonator. Obviously, in other embodiments, only the first trench 130*a* or the second trench

130*b* may be disposed independently. Since the first electrode 103 and the second electrode 105 need to be introduced with electrical signals, it is not suitable for the first trench 130*a* or the second trench 130*b* to form a closed ring shape. At this point, the first trench 130*a* or the second trench 130*b* may not completely surround the region where the protrusions 40 are located. The first trench 130*a* or the second trench 130*b* may be formed into a nearly closed ring, and a non-closed region may be used for introducing electrical signals. Such arrangement manner may simplify process flow and reduce resonator cost.

In one embodiment, a frequency adjustment layer 1010 may be further included, which may be disposed on the surface of the first electrode 103 in the effective resonance region. In another embodiment, the frequency adjustment layer may also be disposed on the surface of the second electrode 105 in the effective resonance region. The frequency adjustment layer 1010 may be used to adjust the frequency of the resonator; and the frequency of the resonator may be related to the thickness of the effective resonance region. When fabricating the filter, the thicknesses of the first electrode 103, the second electrode 105 and the piezoelectric layer 104 of different resonators may be same. In order to make different resonators to have different frequencies, frequency adjustment layers 1010 with different thicknesses may be disposed. In one embodiment, the material of the frequency adjustment layer 1010 may be ethyl silicate. The material of the frequency adjustment layer 1010 may also be silicon oxide, silicon nitride, silicon oxynitride or silicon carbonitride.

In one embodiment, an attaching layer 106 may also be included, which may be disposed above the piezoelectric stacked structure. The attaching layer 106 may enclose a second cavity 110*b*; the second cavity 110*b* may expose the upper surface of the piezoelectric stacked structure; the second cavity 110*b* may be above the first cavity 110*a*; and the first trench 130*a* and the second trench 130*b* may be inside the region enclosed by the second cavity 110*b*. A cap substrate 200 may be further included. The cap substrate 200 may be disposed on the attaching layer 106 and cover the second cavity 110*b*. In one embodiment, the attaching layer 106 may form a closed ring, and the second cavity 110*b* may be a closed cavity. A part of the lower surface of the attaching layer 106 may be connected to the second electrode 105 outside the effective resonance region, and a part may be connected to the first electrode 103 outside the effective resonance region. The attaching layer 106 may be made of a conventional bonding material, such as silicon oxide, silicon nitride, silicon oxynitride, ethyl silicate or the like; or may be made of an adhesive, including a light-solidifying material or a thermal-solidifying material, such as die attach film (DAF) or dry film. The material of the attaching layer and the material of the cap substrate 200 may be same, and the attaching layer and the material of the cap substrate 200 may be an integrated structure. The second cavity 110*b* may be formed by forming a space in the film layer (the attaching layer 106 and the cap substrate 200 formed).

In one embodiment, the resonator may further include a first electrical connection part, a second electrical connection part and a conductive interconnection structure 120; the first electrical connection part may be used for introducing an electrical signal into the first electrode 103 of the effective resonance region, and the second electrical connection part may be used for introducing an electrical signal into the second electrode 105 of the effective resonance region. After the first electrode 103 and the second electrode 105 are connected with electricity, a voltage difference may be generated between the upper and lower surfaces of the piezoelectric layer 104 to form a standing wave oscillation. The conductive interconnection structure 120 may be used to short the first electrode and the second electrode outside the effective resonance region. It can be seen from drawings that the overlapped region of the piezoelectric layer, the first electrode and the second electrode overlap along the direction perpendicular to the piezoelectric layer may be included outside the effective resonance region. When the first electrode and the second electrode are connected with electricity, a voltage difference may also be generated between the upper and lower surfaces of the piezoelectric layer outside the effective resonance region and standing wave oscillation may be also generated. However, standing wave oscillation outside the effective resonance region may be undesirable. In one embodiment, the first electrode and the second electrode outside the effective resonance region may be short-circuited, so that the upper and lower voltages of the piezoelectric layer outside the effective resonance region may be consistent with each other and standing wave oscillation may not be generated outside the effective resonance region, which may improve the Q value of the resonator. Specific structures of the first electrical connection part, the second electrical connection part and the conductive interconnection structure 120 are as follows.

The first electrical connection may include a first through hole 140, where the first through hole 140 may pass through the lower layer structure of the first electrode 103 outside the effective resonance region to expose the first electrode 103; a first conductive interconnection layer 141 which may cover the inner surface of the first through hole 140 and a part of the surface of the carrier substrate 100 around the first through hole 140 and may be connected to the first electrode 103; an insulating layer 160, which may cover the first conductive interconnection layer 141 and the surface of the carrier substrate 100; and a conductive protrusion 142, which may be disposed on the surface of the carrier substrate 100 and electrically connected to the first conductive interconnection layer 141.

The second electrical connection part may include a second through hole 150, where the second through hole 150 may pass through the lower layer structure of the first electrode 103 outside the effective resonance region to expose the first electrode 103; a second conductive interconnection layer 151, which may cover the inner surface of the second through hole 150 and a part of the surface of the carrier substrate 100 around the second through hole 150 and may be connected to the first electrode 103; an insulating layer 160, which may cover the second conductive interconnection layer 151 and the surface of the carrier substrate 100; and a second conductive protrusion 152, which may be disposed on the surface of the carrier substrate 100 and electrically connected to the second conductive interconnection layer 151.

In one embodiment, the conductive interconnection structure 120 may include two parts. A part of the conductive interconnection structure 120 may be disposed in the outer region of the second trench 130*b* to connect the first electrode 103 with the second electrode 105, which may be electrically connected to the first electrical connection part through the first electrode 103. The other part of the conductive interconnection structure 120 may be disposed in the outer region of the first trench 130*a* to connect the first electrode 103 with the second electrode 105, which may be electrically connected to the second electrical connection part through the first electrode 103. Each part of the conductive interconnection structure 120 may be configured with a region covering partial surface of the second electrode 105. Such region may increase the contact region with the second electrode 105, reduce contact resistance, and prevent local high temperature caused by excessive current.

It should be noted that the second electrical connection part may not be directly electrically connected to the second electrode but may be connected to the first electrode outside the effective resonance region and may be electrically connected to the second electrode of the effective resonance region through the conductive interconnection structure 120. It can be seen that the structure of the first electrical connection part and the second electrical connection part may be same, but the disposing positions may be different; the first electrical connection part may be electrically connected to the first electrode inside the effective resonance region to supply power to the first electrode inside the effective resonance region; and the first electrical connection part may be electrically connected to the second electrode outside the effective resonance region through the first electrode outside the effective resonance region and the conductive interconnection structure 120 and may be not connected to the second electrode inside the effective resonance region. Similarly, the second electrical connection part may be connected to the first electrode outside the effective resonance region and the second electrode inside the effective resonance region to supply power to the second electrode inside the effective resonance region.

Exemplary Embodiment Two

Exemplary embodiment two provides a method for fabricating a film bulk acoustic resonator, including following exemplary steps.

At S01, a temporary substrate may be provided.

At S02, the piezoelectric stacked structure may be formed on the temporary substrate, where the piezoelectric stacked structure may include the second electrode, the piezoelectric layer, and the first electrode sequentially disposed from bottom to top.

At S03, protrusions may be formed on one of the first electrode, the second electrode and the piezoelectric layer; or a part of protrusions may be formed on one of the first electrode, the second electrode and the piezoelectric layer, and another part of protrusions may be formed on another one of the first electrode, the second electrode and the piezoelectric layer; where the projections of the protrusions on the piezoelectric layer may be located at the boundary of the effective resonance region.

At S04, the support layer may be formed to cover the piezoelectric stacked structure.

At S05, the support layer may be patterned to form the first cavity; and the first cavity may pass through the support layer.

At S06, the carrier substrate may be bonded on the support layer; and the carrier substrate may cover the first cavity.

At S07, the temporary substrate may be removed.

FIGS. 2-8 illustrate structural schematics corresponding to certain stages of a method for fabricating a resonator according to exemplary embodiment two of the present disclosure. Referring to FIGS. 2-8, each exemplary step is described in detail.

Figure 2:
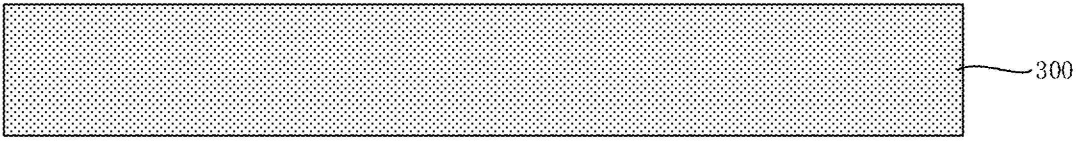
FIGS. 2-8 illustrate structural schematics corresponding to certain stages of a method for fabricating a film bulk acoustic resonator according to exemplary embodiment two of the present disclosure.

Referring to FIG. 2, step S01 of providing the temporary substrate 300 may be performed.

The temporary substrate 300 may be made of at least one of following mentioned materials, including silicon (Si), germanium (Ge), silicon germanium (SiGe), silicon carbon (SiC), silicon germanium carbon (SiGeC), indium arsenide (InAs), gallium arsenide (GaAs), indium phosphide (InP) or other III/V compound semiconductors, a ceramic substrate such as alumina, a quartz, glass substrate, or the like.

Figure 3:
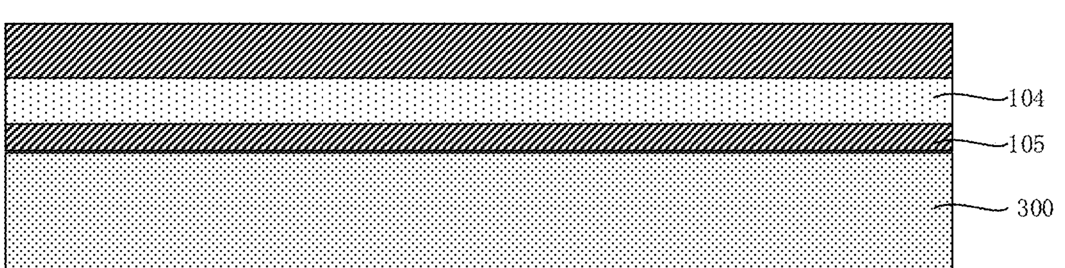
Figure 4:
Figure 4:
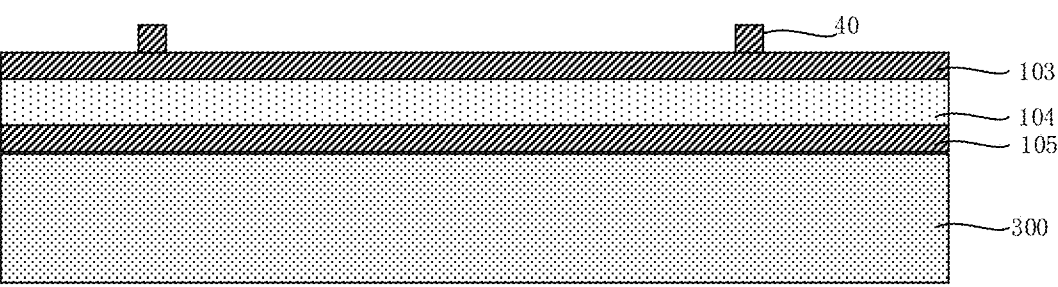

Referring to FIGS. 3-4, step S02 may be performed. Step S02 is that the piezoelectric stacked structure may be formed on the temporary substrate 300, where the piezoelectric stacked structure may include the second electrode 105, the piezoelectric layer 104, and the first electrode 103 sequentially disposed from bottom to top. Step S03 may be performed. Step S03 is that the protrusions 40 may be formed on one of the first electrode 103, the second electrode 105 and the piezoelectric layer 104; or a part of the protrusions may be formed on one of the first electrode, the second electrode and the piezoelectric layer, and another part of the protrusions may be formed on another one of the first electrode, the second electrode and the piezoelectric layer. The projections of the protrusions 40 on the piezoelectric layer 104 may be coincident with the boundary of the effective resonance region.

In one embodiment, all protrusions 40 may be formed on the first electrode 103. The projections of the formed protrusions 40 along the direction perpendicular to the piezoelectric layer 104 may be an irregular polygon, such as a pentagon, a hexagon, or a circle or an ellipse. It should be noted that "on" described in step S03 may indicate connection with a corresponding film layer, including on the upper surface or the lower surface of the film layer. When the protrusions are on the first electrode, it includes that the protrusions may be on the upper surface or the lower surface of the first electrode; when the protrusions are on the second electrode, it includes that the protrusions may be on the upper surface or the lower surface of the second electrode; when the protrusions are on the piezoelectric layer, it includes the protrusions may be on the upper surface or the lower surface of the piezoelectric layer.

The materials of the second electrode 105 and the first electrode 103 may be any suitable conductive materials or semiconductor materials known to those skilled in the art, where the conductive material may be a metal material with conductive property, for example, the conductive material may be made of one of metals or a stacked layer of metals including molybdenum (Mo), aluminum (Al), copper (Cu), tungsten (W), tantalum (Ta), platinum (Pt), ruthenium (Ru), rhodium (Rh), iridium (Ir), chromium (Cr), titanium (Ti), gold (Au), osmium (Os), rhenium (Re), palladium (Pd) and/or the like; and the semiconductor material may be, for example, Si, Ge, SiGe, SiC, SiGeC or the like. The second electrode 105 and the first electrode 103 may be formed by physical vapor deposition such as magnetron sputtering, evaporation, or chemical vapor deposition. The piezoelectric layer 104 may be made of aluminum nitride (AlN), zinc oxide (ZnO), lead zirconate titanate (PZT), lithium niobate ($LiNbO_3$), quartz, potassium niobate ($KNbO_3$) or tantalic acid piezoelectric materials having a wurtzite crystal structure such as lithium ($LiTaO_3$), and a combination thereof. When the piezoelectric layer 104 includes aluminum nitride (AlN), the piezoelectric layer 104 may further include a rare earth metal such as at least one of scandium (Sc), erbium (Er), yttrium (Y), and lanthanum (La). In addition, when the piezoelectric layer 104 includes aluminum nitride (AlN), the piezoelectric layer 104 may further include a transition metal such as at least one of zirconium (Zr), titanium (Ti), manganese (Mn), and hafnium (Hf). The piezoelectric layer 104 may be deposited using any suitable manners known to those skilled in the art, such as chemical vapor deposition, physical vapor deposition, or atomic layer deposition. Optionally, in one embodiment, the second electrode 105 and the first electrode 103 may be made of metal molybdenum (Mo), and the piezoelectric layer 104 may be made of aluminum nitride (AlN).

In one embodiment, the method for forming the protrusions 40 is that after the second electrode 105 and the piezoelectric layer 104 are formed, a conductive material layer may be formed on the piezoelectric layer 104, where the thickness of the conductive material layer formed at this point is the sum of the thicknesses of the first electrodes 103 and the protrusions 40; after the conductive material layer is formed, the conductive material layer with a preset thickness may be etched to form the protrusions 40 and the first electrode 103. Various methods may be used for forming the protrusions in the present disclosure; and according to the materials for forming the protrusions, the methods may be divided into following two forms.

For the first form, a structural material layer may be formed on the temporary substrate, and an etching process may be performed on the structural material layer to form the protrusions. The structural material layer may be used to form the first electrode, the second electrode or the piezoelectric layer. In one embodiment, the method for forming the protrusions 40 may be the first form.

For the second form, after forming the first electrode, the second electrode or the piezoelectric layer, a protrusion material layer may be formed, and the protrusions may be formed by performing an etching process on the protrusion material layer.

For the first form, the materials of the protrusions and the structure material layer may be same, and the structure material layer and the protrusion material layer may be formed by one deposition process, thereby reducing the number of process steps. For the second form, the materials of the protrusion material layer and the structural material layer may be different and need to be formed by two deposition processes; however, the selection of the protrusion material layer may not be limited to be same as the material of the first electrode, the second electrode or the piezoelectric layer, and the selection range of the protrusion material layer may be wider.

For any of above-mentioned forms, specific methods for forming the piezoelectric stacked structure and the protrusions may include following exemplary methods.

For method 1, after the second electrode, the piezoelectric layer, and the first electrode are formed sequentially on the temporary substrate, the protrusions may be formed on the first electrode. At this point, the material of the protrusions and the material of the first electrode may be same or different. In one embodiment, such two materials may be same, the conductive material layer may be formed by a deposition process, and the first electrode and the protrusions may be formed by an etching process. In other embodiments, such two materials may be different, the first electrode may be formed first, then the protrusion material layer may be formed by a deposition process, and then the protrusions may be formed by an etching process.

For method 2, the protrusions may be formed on the temporary substrate; and the second electrode, the piezoelectric layer, and the first electrode may be sequentially formed on the temporary substrate and the protrusions. Such method may also include two cases. One case is that the material of the protrusion and the material of the second electrode may be same and formed by one deposition process. At this point, the conductive material layer may be formed on the temporary substrate, and the thickness of the conductive material layer may be the sum of the heights of the protrusions and the second electrode, and then the protrusions and the second electrode may be formed by an etching process. The other case is that the protrusions and the second electrode may be formed separately. The protrusion material layer may be formed first, the protrusions may be formed by an etching process, the second electrode may be formed on the protrusions and the temporary substrate, and then the piezoelectric layer and the first electrode may be formed sequentially.

For method 3, the second electrode may be formed on the temporary substrate, the protrusions may be formed on the second electrode, and the piezoelectric layer and the first electrode may be sequentially formed on the protrusions and the second electrode. The difference between method 3 and method 2 is that the protrusions of method 2 may be formed on the lower surface of the second electrode, and the protrusions of method 3 may be formed on the upper surface of the second electrode. The formation method may refer to method 2, which may not be described in detail herein.

For method 4, the second electrode and the piezoelectric layer may be sequentially formed on the temporary substrate, the protrusions may be formed on the piezoelectric layer, and the first electrode may be formed on the protrusions and the piezoelectric layer. The protrusions of this method may be formed on the piezoelectric layer, either on the upper surface of the piezoelectric layer or on the lower surface of the piezoelectric layer. The material of the protrusions may be same as the material of the piezoelectric layer or may be different from the material of the piezoelectric layer. The methods of forming the protrusions with same and different materials may refer to the methods of forming protrusions on the surface of the first electrode or the second electrode in method 1, method 2 or method 3 for, which may not be described in detail herein.

For method 5, after the second electrode, the piezoelectric layer, and the first electrode are formed sequentially on the temporary substrate, a part of the protrusions may be formed on the first electrode, and after removing the temporary substrate, another part of the protrusions may be formed on the second electrode. In such method, the protrusion may include two parts, which may be formed on the first electrode and the second electrode, respectively. The projections of two protrusions perpendicular to the piezoelectric layer may be coincident with the boundary of the effective resonance region of the resonator. Specific method of forming the protrusions may refer to the method 1, the method 2 or the method 3, which may not be described in detail herein.

The above are only several different methods of forming the protrusions. It should be understood that there are other methods, such as when the protrusions include two parts, one part may be formed on the piezoelectric layer and another part may be formed on the first electrode or the second electrode, as long as the protrusions are formed on the piezoelectric stacked structure and at the boundary of the effective resonance region.

Figure 5:
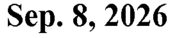
Figure 5:
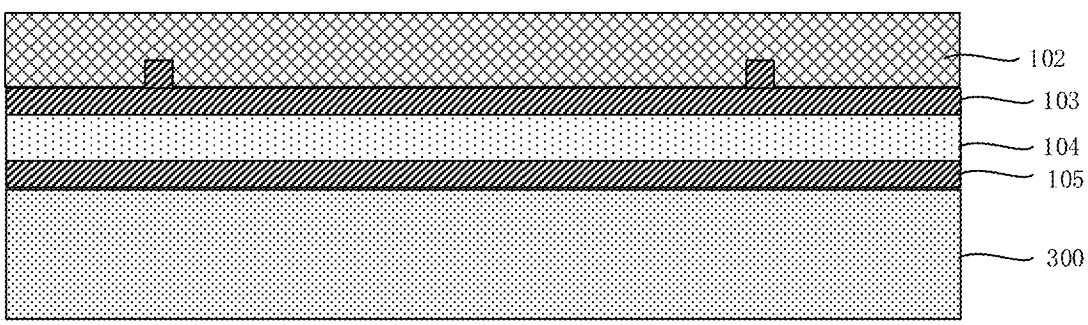

Referring to FIG. 5, step S04 of forming the support layer 102 to cover the piezoelectric stacked structure may be performed.

The support layer 102 may be formed by physical vapor deposition or chemical vapor deposition. The material of the support layer 102 may be any suitable dielectric materials, which may include, but may not be limited to, at least one of silicon oxide, silicon nitride, silicon oxynitride, silicon carbonitride and other materials.

Figure 6:
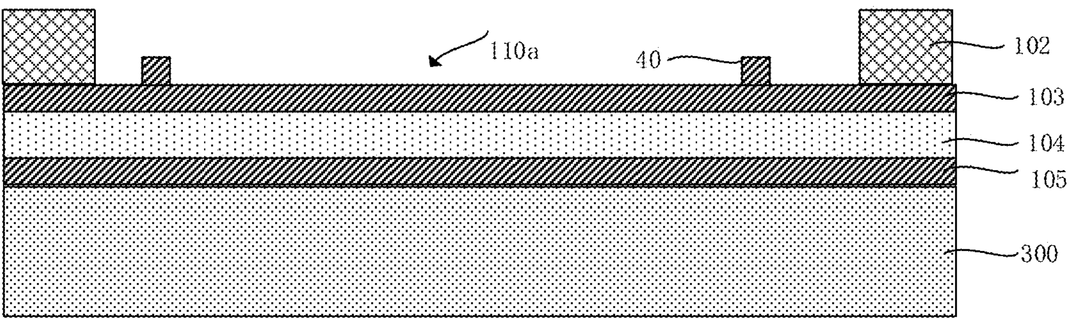

Referring to FIG. 6, step S05 is performed. S05 may be that the support layer 102 may be patterned to form the first cavity 110*a*, where the first cavity 110*a* may pass through the support layer 102.

The first cavity 110*a* may be formed by etching the support layer 102 through an etching process, and the first electrode layer 103 and the protrusions 40 at the bottom may be exposed. The etching process may be a wet etching process or a dry etching process; and the dry etching process may include, but may not be limited to, reactive ion etching (RIE), ion beam etching and plasma etching. The depth and shape of the first cavity 110*a* may depend on the depth and shape of the cavity required for the bulk acoustic resonator to be fabricated, that is, the depth of the first cavity 110*a* may be determined by the thickness of formed support layer 102. The shape of the bottom surface of the first cavity 110*a* may be a rectangle or a polygon other than a rectangle such as a pentagon, a hexagon, an octagon and the like, or may also be a circle or an ellipse.

Figure 7:
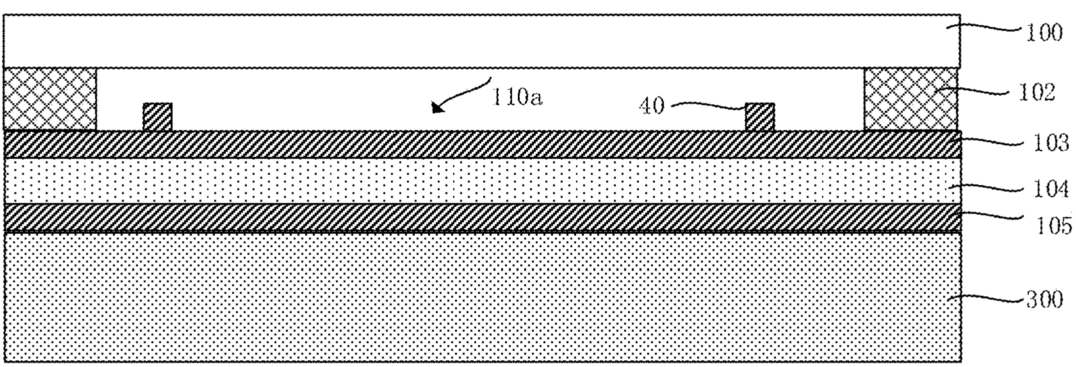

Referring to FIG. 7, step S06 may be performed. S06 is that the carrier substrate 100 may be bonded on the support layer 102, where the carrier substrate may cover the first cavity 110*a*. The material of the carrier substrate 100 may refer to the material of the temporary substrate 300. The bonding between the carrier substrate 100 and the support layer 102 may be realized by thermocompression bonding, or the bonding between the carrier substrate 100 and the support layer 102 may be realized by dry film bonding.

Figure 8:
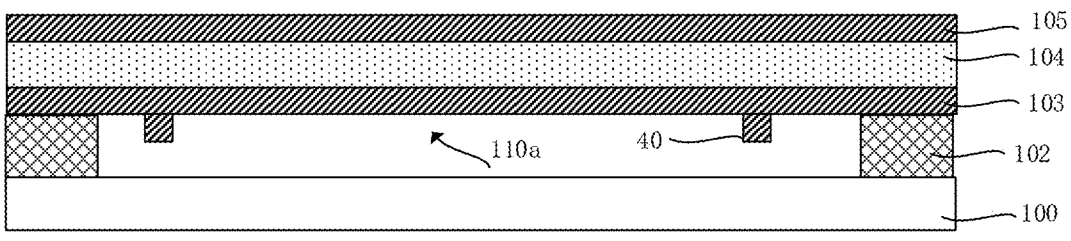

Referring to FIG. 8, step S07 of removing the temporary substrate may be performed. The manner of removing the temporary substrate may be mechanical grinding.

Exemplary Embodiment Three

A method for fabricating a film bulk acoustic resonator is provided in one embodiment. FIGS. 9-15 illustrate structural schematics corresponding to certain stages of a method for fabricating a resonator according to exemplary embodiment three of the present disclosure.

Referring to FIGS. 9-15, steps S01 to S05 in one embodiment may be same as exemplary embodiment two. The main difference from exemplary embodiment two is that after step S05 is performed and before step S06 is performed, the method may further include that the first trench 130*a* surrounding a part of the protrusions 40 may be formed at the bottom of the first cavity 110*a* and on the periphery of the protrusion 40, where the first trench 130*a* may pass through the first electrode 103. After step S07 is performed, the method may further include that the second trench 130*b* may be formed on the second electrode 105 and on the side opposite to the first trench 130*a*, where the second trench 130*b* may surround another part of the protrusions 40, and the second trench 130*b* may pass through the second electrode 105. The projections of the first trench 130*a* and the second trench 130*b* on the carrier substrate 100 may include two junctions; and at each junction, adjacent ends of the first and second trenches may be connected or have a spacing there-between.

Figure 9:
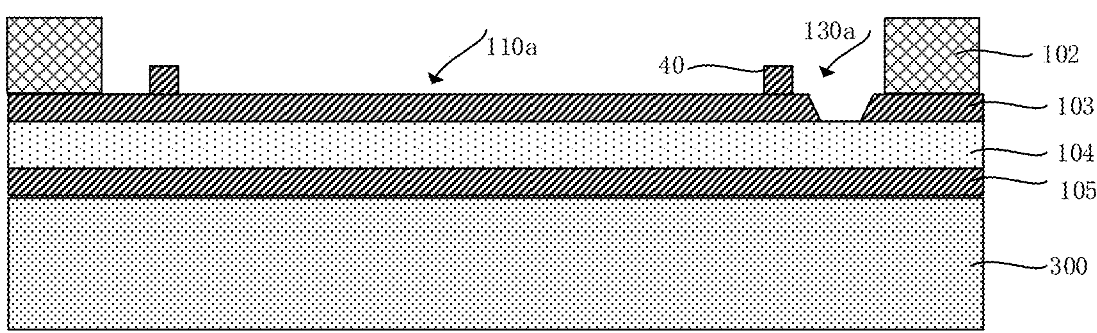
FIGS. 9-15 illustrate structural schematics corresponding to certain stages of a method for fabricating a film bulk acoustic resonator according to exemplary embodiment three of the present disclosure.

For example, referring to FIG. 9, the first electrode layer 103 may be etched to form the first trench 130*a* in the first cavity 110*a* and on the periphery of the protrusion 40, where the sidewalls of the first trenches 130*a* may be inclined or vertical. In one embodiment, the sidewall of the first trench 130*a* may form an obtuse angle with the plane where the piezoelectric layer 104 is located (the shape of the longitudinal section (section along the film thickness direction) of the first trench 130*a* may be a trapezoid). The projection of the first trench 130*a* on the plane where the piezoelectric layer 104 is located may be a semi-ring shape or a polygon similar to a semi-ring shape.

Figure 10:
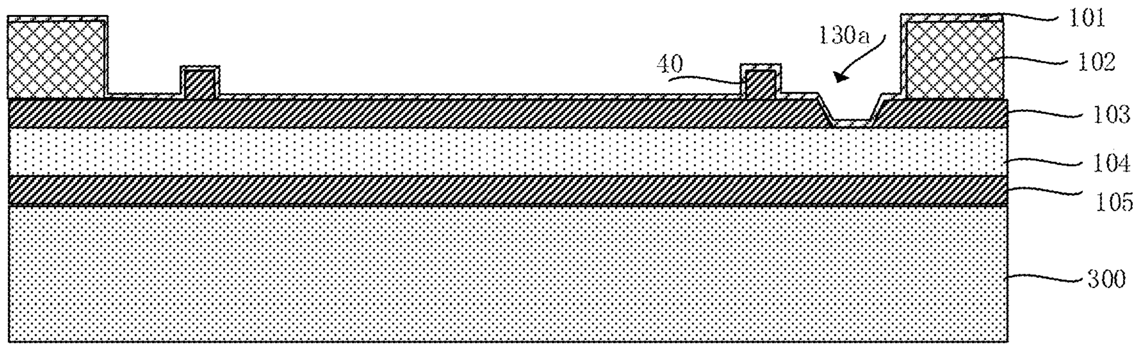

Referring to FIG. 10, in one embodiment, after forming the first trench 130*a*, the method may further include that the bonding layer 101 may be formed on the surface of the support layer 102, where the bonding layer 101 may be used for bonding the support layer 102 and the carrier substrate 100. The bonding layer 101 may be formed on the surfaces of the support layer 102, the first electrode 103, the protrusion 40 and the first trench 130*a* by a deposition process. The material of the bonding layer may include silicon oxide, silicon nitride, silicon oxynitride, silicon carbonitride or ethyl silicate. From the material of the support layer 102 described above, the materials of the support layer 102 and the bonding layer 102 may be the same. In one embodiment, the material of the bonding layer 101 may be ethyl silicate.

Figure 11:
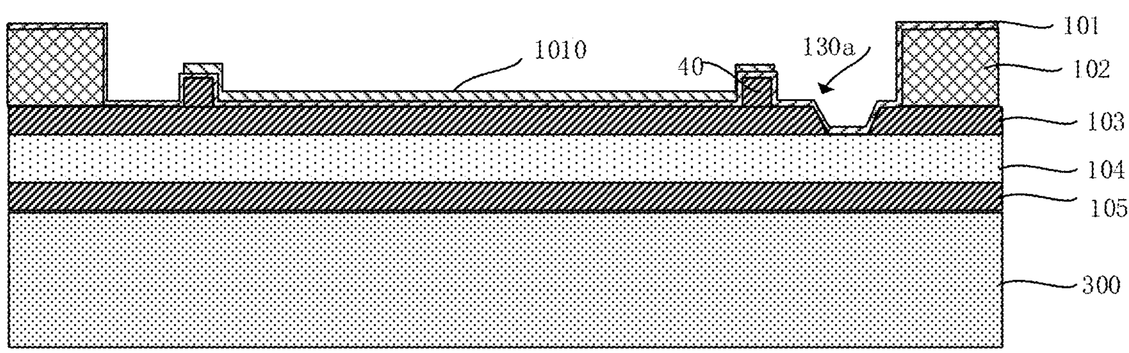

Referring to FIG. 11, after forming the bonding layer 101 in one embodiment, the method may further include forming the frequency adjustment layer 1010 on the surface of the first electrode 103 surrounded by the protrusions 40. It should be noted that forming the frequency adjustment layer 1010 and the bonding layer may be two independent steps. The bonding layer 102 may not be formed before the frequency adjustment layer 1010 is formed. The material of the frequency adjustment layer 1010 may include silicon oxide, silicon nitride, silicon oxynitride, silicon carbonitride or ethyl silicate. In one embodiment, the material of the frequency adjustment layer 1010 and the material of the bonding layer 101 may be same as ethyl silicate. A manner of forming the bonding layer 101 and the frequency adjustment layer 1010 may include physical vapor deposition or chemical vapor deposition. The function of the frequency adjustment layer 1010 may refer to the description of exemplary embodiment one, which may not be described in detail herein.

Figure 12:
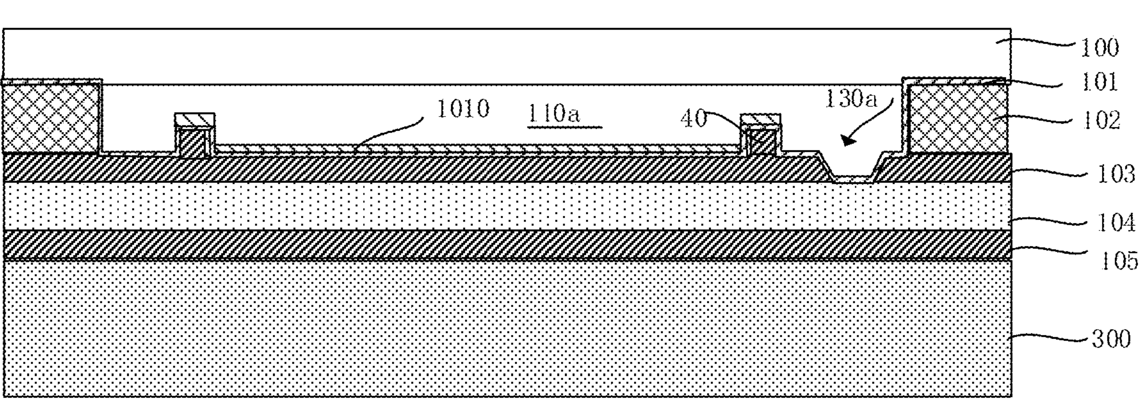

Referring to FIG. 12, step S06 of bonding the carrier substrate 100 on the bonding layer 101 may be performed, where the carrier substrate 100 may cover the first cavity 110*a*. The material of the carrier substrate 100 may refer to the material of the temporary substrate 300. The carrier substrate 100 and the support layer 102 may be bonded through the bonding layer 101.

Figure 13:
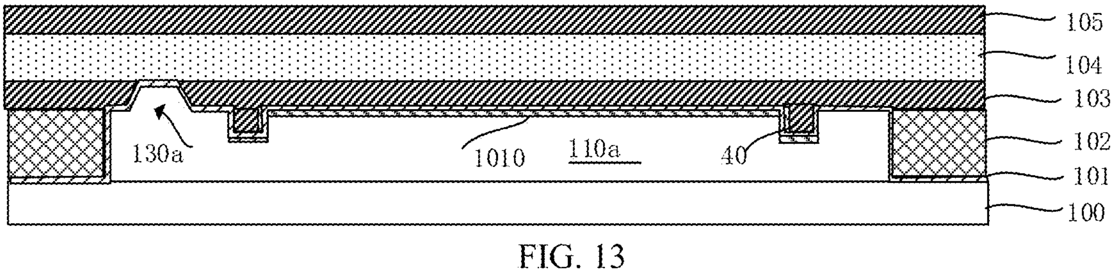

Referring to FIG. 13, step S07 of removing the temporary substrate may be performed.

Figure 14:
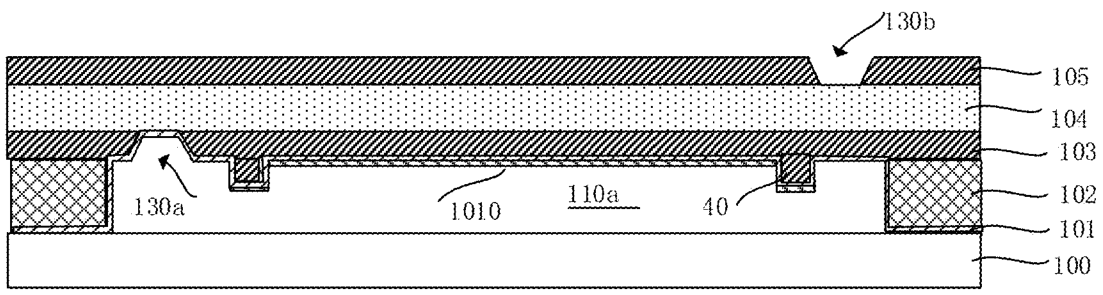

Referring to FIG. 14, after removing the temporary substrate, the second trench 130*b* may be formed on the second electrode 105 and at the side opposite to the first trench 130*a*. The second trench 130*b* may surround another part of the protrusions 40, and the second trench 130*b* may pass through the second electrode 105. In one embodiment, the junctions of the projections of the first trench 130*a* and the second trench 130*b* on the carrier substrate 100 may be connected to form a closed irregular polygon. The structure and formation method of the second trench 130*b* may refer to the structure and formation method of the first trench 130*a*. In other embodiments, only the first trench 130*a* or the second trench 130*b* may be formed independently. The structures and functions of the first trench 130*a* and the second trench 130*b* may refer to exemplary embodiment one, which may not be described in detail herein.

Figure 15:
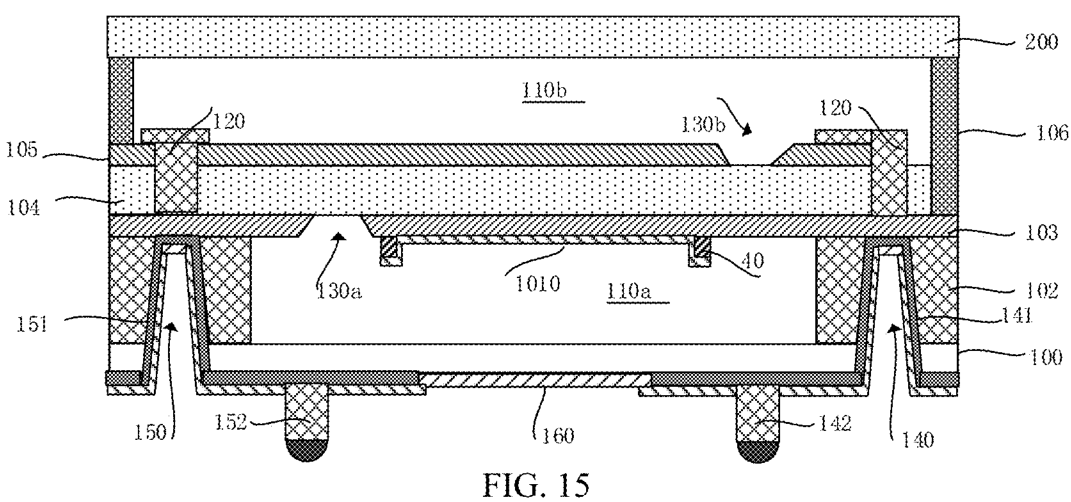

Referring to FIG. 15, in one embodiment, after removing the temporary substrate, the method may further include that the attaching layer 106 may be formed on the piezoelectric stacked structure, where the attaching layer 106 may enclose the second cavity 110*b*, the second cavity 110*b* may be above the first cavity 110*a*, and the protrusions 40 may be inside the second cavity 110*b*; the cap substrate 200 may be bonded on the attaching layer 106, where the cap substrate 200 may cover the second cavity 110*b*. The method may further include forming the first electrical connection part and the second electrical connection part, where the first electrical connection part may be used for electrical connection with the first electrode of the effective resonance region, and the second electrical connection part may be used for electrical connection with the second electrode of the effective resonance region. The method may further include forming the conductive interconnection structure 120 connected to the first electrode 103 and the second electrode 105 outside the effective resonance region.

Forming the first electrical connection may include that the first through hole 140 passing through the lower layer structure of the first electrode 103 may be formed by an etching process, where the first through hole 140 may expose the first electrode 103; the first conductive interconnection layer 141 may be formed in the first through hole 103 by an electroplating process or a physical vapor deposition process, where the first conductive interconnection layer 141 may cover the inner surface of the first through hole 140 and a part of the surface of the carrier substrate 100 around the first through hole 140 and may be connected to the first electrode 103; the insulating layer 160 may be formed on the surface of the first conductive interconnection layer 141 by a deposition process; the first conductive protrusion 142 may be formed on the surface of the carrier substrate 100, where the first conductive protrusion 142 may be electrically connected to the first conductive interconnection layer 141.

Forming the second electrical connection may include that the second through hole 150 passing through the lower layer structure of the first electrode 103 may be formed by an etching process, where the second through hole 150 may expose the first electrode 103; the second conductive interconnection layer 151 may be formed in the second through hole 150 by a deposition process or an electroplating process, where the second conductive interconnection layer 151 may cover the inner surface of the second through hole 150 and a part of the surface of the carrier substrate 100 around the second through hole 150 and may be connected to the first electrode 103; the insulating layer 160 may be formed on the surface of the second conductive interconnection layer 151 by a deposition process; the second conductive protrusion 152 may be formed on the surface of the carrier substrate 100, where the second conductive protrusion 152 may be electrically connected to the second conductive interconnection layer 151.

The first electrical connection part and the second electrical connection part may have same structure but different positions, so the first electrical connection part and the second electrical connection part may be formed simultaneously, thereby saving process steps and shortening fabrication cycle.

In one embodiment, the conductive interconnection structure 120 may include two parts, the positions of two parts of the conductive interconnection structure may refer to exemplary embodiment one, and the formation methods of two parts of the conductive interconnection structure 120 may be same. The method may include forming the through hole through an etching process outside the effective resonance region, where the through hole may pass through the second electrode 105 and the piezoelectric layer 104 to expose the first electrode 103. The conductive interconnection structure 120 may be formed in the through hole by an electroplating process. In one embodiment, the material of the conductive interconnection structure 120 may be same as the material of each of the first conductive interconnection layer 141 and the second conductive interconnection layer 151, which may be copper. The function of the conductive interconnection structure 120 may refer to exemplary embodiment one.

The materials of the cap substrate 200 and the attaching layer 106 may refer to exemplary embodiment one.

From the above-mentioned embodiments, it can be seen that the technical solutions provided by the present disclosure may achieve at least following beneficial effects.

Protrusions may be disposed along the boundary of the effective resonance region, so that the acoustic impedance inside the effective resonance region may be mismatched with the acoustic impedance of the region where the protrusions are located, thereby effectively preventing lateral acoustic wave leakage and improving the quality factor of the resonator.

Furthermore, the effective resonance region of the resonator may be defined by the first trench and the second trench; the first trench and the second trench may pass through the first electrode and the second electrode respectively; and the piezoelectric layer may be intact film layer without etching, thereby ensuring the structural strength of the resonator and improving the yield of the resonator.

Furthermore, the first electrode and the second electrode outside the effective resonance region may have the overlapped region along the direction perpendicular to the piezoelectric layer. The resonator may also include the conductive interconnection structure connecting the first electrode and the second electrode outside the effective resonance region. In such way, the first electrode and the second electrode outside the effective resonance region may be short-circuited, a voltage difference may not be between the upper and lower surfaces of the piezoelectric layer outside the effective resonance region, and no standing wave oscillation may not be generated outside the effective resonance region.

Furthermore, the frequency adjustment layer may be disposed in the effective resonance region, and overall thickness of the effective resonance region may be changed by setting the thickness of the frequency adjustment layer, thereby changing resonator frequency.

It should be noted that each embodiment in the present specification is described in a related manner; same and similar parts between various embodiments may be referred to each other; and each embodiment may highlight the differences from the other embodiments. In particular, since method embodiments are basically similar to structural embodiments, the description may be relatively simple, and reference may be made to some descriptions of method embodiments.

Above-mentioned description may be merely for the description of preferred embodiments of the present disclosure and may not be intended to limit the scope of the present disclosure. Any changes and modifications based on above-mentioned embodiments made by those skilled in the art may all be within the scope of the present disclosure.

What is claimed is:

1. A film bulk acoustic resonator, comprising:

a carrier substrate;

a piezoelectric stacked structure, including a first electrode over the carrier substrate, a piezoelectric layer over the first electrode, and a second electrode over the piezoelectric layer;

a support layer, disposed between the carrier substrate and the first electrode of the piezoelectric stacked structure, and enclosing a first cavity there-between; and protrusions, disposed on the first electrode of the piezoelectric stacked structure and protruding into the first cavity at a boundary of an effective resonance region of the film bulk acoustic resonator.

2. The film bulk acoustic resonator according to claim 1, wherein:

projections of the protrusions on the carrier substrate form a ring shape, and an inside of the ring shape is the effective resonance region; and/or a projection of the piezoelectric layer on the carrier substrate covers the first cavity.

3. The film bulk acoustic resonator according to claim 1, wherein:

the protrusions are made of a material including a dielectric material; or a material of the protrusions is same as a material of the first electrode or the second electrode.

4. The film bulk acoustic resonator according to claim 1, further including:

a first trench inside the first cavity, wherein the first trench passes through the first electrode, exposes a surface portion of the piezoelectric layer, and surrounds a periphery of the effective resonance region of the protrusions.

5. The film bulk acoustic resonator according to claim 4, further including:

a second trench, disposed opposite to the first trench, wherein the second trench passes through the second electrode, exposes a surface portion of the piezoelectric layer, and surrounds the periphery of the effective resonance region of the protrusions.

6. The film bulk acoustic resonator according to claim 5, wherein:

inner edges of the first trench and the second trench are coincident with an outer boundary of the protrusions.

7. The film bulk acoustic resonator according to claim 5, further including:

an attaching layer, disposed above the piezoelectric stacked structure, wherein the attaching layer encloses a second cavity which exposes a surface of the piezoelectric stacked structure; the second cavity is above the first cavity; and the first trench and the second trench are inside a region enclosed by the second cavity; and a cap substrate, disposed on the attaching layer and covering the second cavity.

8. The film bulk acoustic resonator according to claim 1, further including:

a frequency adjustment layer, disposed on a surface of the first electrode in the effective resonance region.

9. The film bulk acoustic resonator according to claim 1, wherein:

the support layer is made of a material including silicon oxide, silicon nitride, silicon oxynitride, silicon carbonitride, or ethyl silicate.

10. The film bulk acoustic resonator according to claim 8, wherein the frequency adjustment layer is further disposed on sidewalls of the protrusions in the effective resonance region and on top surfaces of the protrusions inside the first cavity.

11. The film bulk acoustic resonator according to claim 1, wherein:

the first electrode and the second electrode outside the effective resonance region have an overlapped portion along a direction perpendicular to the piezoelectric layer; and the film bulk acoustic resonator further includes a conductive interconnection structure, connecting the first electrode and the second electrode outside the effective resonance region.

* * * * *